United States Patent
Morimoto et al.

(10) Patent No.: US 7,507,641 B2
(45) Date of Patent: Mar. 24, 2009

(54) METHOD OF PRODUCING BONDED WAFER

(75) Inventors: Nobuyuki Morimoto, Tokyo (JP); Hideki Nishihata, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/823,010

(22) Filed: Jun. 25, 2007

(65) Prior Publication Data
US 2008/0124897 A1    May 29, 2008

(30) Foreign Application Priority Data
Jun. 26, 2006    (JP) .............................. 2006-175751

(51) Int. Cl.
H01L 21/322    (2006.01)
(52) U.S. Cl. ................... 438/475; 438/473; 438/513; 257/E21.237; 257/E21.248; 257/E21.319; 257/E21.347
(58) Field of Classification Search ............... 438/473, 438/474, 475, 479, 480, 437, 458, 502, 509, 438/513, 514, 535
See application file for complete search history.

(56) References Cited

U.S. PATENT DOCUMENTS

| | | | | |
|---|---|---|---|---|
| 6,197,697 B1 * | 3/2001 | Simpson et al. | ............. | 438/705 |
| 6,225,193 B1 * | 5/2001 | Simpson et al. | ............. | 438/460 |
| 7,148,124 B1 * | 12/2006 | Usenko | ............. | 438/458 |
| 2004/0166650 A1 | 8/2004 | Yokokawa et al. | | |
| 2004/0253795 A1 | 12/2004 | Martinez et al. | | |
| 2005/0229842 A1 | 10/2005 | Umeno et al. | | |

FOREIGN PATENT DOCUMENTS

| | | |
|---|---|---|
| CN | 1692482 A | 11/2005 |
| EP | 1487012 A | 12/2004 |
| JP | 02-140937 A | 5/1990 |

OTHER PUBLICATIONS

Chinese Office Action dated Aug. 29, 2008 (with English Translation).
T. Suni et al., "Effects of Plasma Activation on Hydrophilic Bonding of Si and SiO2", Journal of the Electrochemical Society, 149 (6), pp. G348-G351, 2002.
M. Akatsuka et al., "Slip Length in Silicon Wafers Caused by Indentation during Heat Treatment", Japanese Journal of Applied Physics, vol. 37, Part 1, No. 10, pp. 5444-5450, 1998.
European Search Report for Application No. EP07012365 dated Oct. 11, 2007.

* cited by examiner

Primary Examiner—David Nhu
(74) Attorney, Agent, or Firm—Sughrue Mion, PLLC

(57) ABSTRACT

A bonded wafer is produced by implanting ions of a light element into a wafer for active layer to a predetermined depth position to form an ion implanted layer, bonding the wafer for active layer to a wafer for support substrate directly or through an insulating film of not more than 50 nm, exfoliating the wafer for active layer at the ion implanted layer and thinning an active layer exposed through the exfoliation to form the active layer having a predetermined thickness, in which the thickness of the active layer before the thinning is not more than 750 nm and an elongation of slip dislocation in a strength test of the wafer for active layer before the bonding is not more than 100 μm at a predetermined thickness.

3 Claims, 2 Drawing Sheets

METHOD OF PRODUCING BONDED WAFER

BACKGROUND OF THE INVENTION

1. Field of the Invention

This invention relates to a method of producing a bonded wafer comprising the steps of implanting ions of a light element such as hydrogen or helium to a predetermined depth position of a wafer for active layer, bonding the wafer for active layer to a wafer for support substrate and then exfoliating the ion implanted portion through a heat treatment.

2. Description of Related Art

As the production method of the bonded wafer, there is known a so-called smart cut method comprising the steps of implanting ions of a light element such as hydrogen, helium or the like into a wafer for active layer at a predetermined depth position to form an ion implanted layer, bonding the wafer for active layer to a wafer for support substrate directly or through an insulating film having a thickness of not more than 50 µm, exfoliating the wafer for active layer at the ion implanted layer and thinning an active layer portion exposed by the exfoliation to form an active layer having a predetermined thickness. In this smart cut method, the portion of the wafer exfoliated after the bonding can be recycled as a wafer, which is different from the conventional bonding technique. By such a recycling can be used one wafer (wafer for the active layer) in the bonded wafer plural times, which leads the way to reduce the material cost. Also, the wafer produced by the smart cut method is excellent in the uniformity of film thickness, so that the smart cut method is noticed as a production method with future potential.

In the bonded wafer produced by the smart cut method, however, there is a problem that as a buried oxide film (insulating film) 3 becomes thinner, voids or blisters are easily generated at the bonding interface to deteriorate the yield as shown in FIG. 1. This is considered due to the fact that when the insulating film has a certain degree of thickness, gases generated by the exfoliation heat treatment can be incorporated into the buried oxide film, but when the buried oxide film becomes too thin, the volume of the gas to be incorporated is decreased and hence the gases generated in the exfoliation heat treatment can not be completely incorporated into the buried oxide film and the remaining gas 15 results in the occurrence of voids or blisters.

As a means for suppressing the occurrence of voids or blisters, it is useful to use a method wherein the thickness of the active layer is changed in accordance with the thickness of the insulating film or concretely the strength of the active layer is enhanced by diminishing the thickness of the active layer corresponding to a portion of the insulating film thinned. For example, as disclosed in JP-A-2004-259970, there is a method wherein the thickness of the active layer having a strength capable of suppressing the voids or blisters before thinning can be experimentally calculated with respect to the thickness of the oxide film to set conditions for obtaining a suitable thickness of the active layer in the implantation of light element ions.

In the method of JP-A-2004-259970, however, as the thickness of the oxide film is thinned to not more than 50 nm, the thickness of the active layer should be thickened over 750 nm, which means that the implantation depth in the ion implantation also exceeds 750 nm. If the ion implantation is carried out up to such an implantation depth, it is required to use an expensive apparatus capable of applying a higher voltage and also a polishing quantity for the subsequent thinning of the active layer becomes larger, and hence there is a fear that the uniformity of the thickness of the active layer is not sufficient.

For this end, it is desired to develop a method wherein the occurrence of voids or blisters can be suppressed without thickening the thickness of the active layer before the thinning even in the production of the bonded wafer having a thinner thickness of an oxide film (particularly not more than 50 nm) or the bonded wafer having no oxide film.

SUMMARY OF THE INVENTION

It is, therefore, an object of the invention to provide a method of producing a bonded wafer wherein the occurrence of voids or blisters can be effectively suppressed by using a wafer for active layer having a predetermined strength without thickening the thickness of the active layer before thinning even when the thickness of the insulating film is not more than 50 nm (inclusive of no insulating film).

In order to achieve the above object, the summary and construction of the invention are as follows.

(1) A method of producing a bonded wafer which comprises the steps of implanting ions of a light element such as hydrogen or helium into a wafer for active layer to a predetermined depth position to form an ion implanted layer, bonding the wafer for active layer to a wafer for support substrate directly or through an insulating film of not more than 50 nm, exfoliating the wafer for active layer at the ion implanted layer and thinning an active layer exposed through the exfoliation to form the active layer having a predetermined thickness, in which the thickness of the active layer before the thinning is not more than 750 nm and an elongation of slip dislocation in a strength test of the wafer for active layer before the bonding is not more than 100 µm at a predetermined thickness.

(2) A method of producing a bonded wafer according to item (1), wherein the wafer for active layer contains one or more components selected from B: not less than $9.0 \times 10^{18}$ atoms/cm$^3$, O: not less than $1.3 \times 10^{18}$ atoms/cm$^3$ and C: not less than $1.0 \times 10^{16}$ atoms/cm$^3$.

(3) A method of producing a bonded wafer according to item (1) or (2), wherein at least one surface of the wafers to be bonded is subjected to a plasma treatment with a gas of nitrogen, oxygen, helium or a mixture thereof before the bonding.

According to the invention, there can be provided a method of producing a bonded wafer wherein the occurrence of voids or blisters can be effectively suppressed by using a wafer for active layer having a predetermined strength without thickening the thickness of the active layer before thinning (particularly not more than 750 nm) even when the thickness of the insulating film is not more than 50 nm (inclusive of no insulating film).

DESCRIPTION OF THE PREFERRED EMBODIMENTS

The method of producing the bonded wafer according to the invention will be described with reference to the accompanying drawings.

Figure 1:
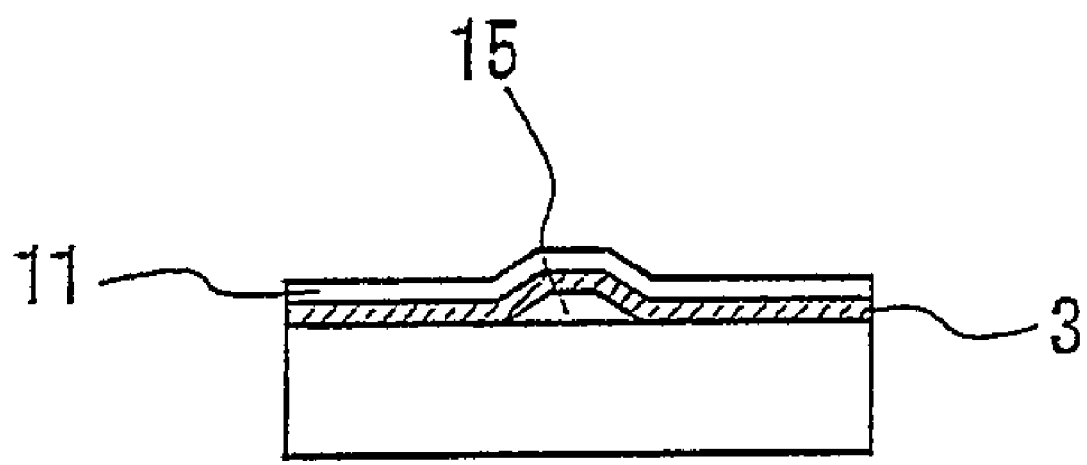
FIG. 1 is a view for explaining a problem of the conventional bonded wafer and showing a state of generating a blister (swelling) in an active layer.
Figure 2:
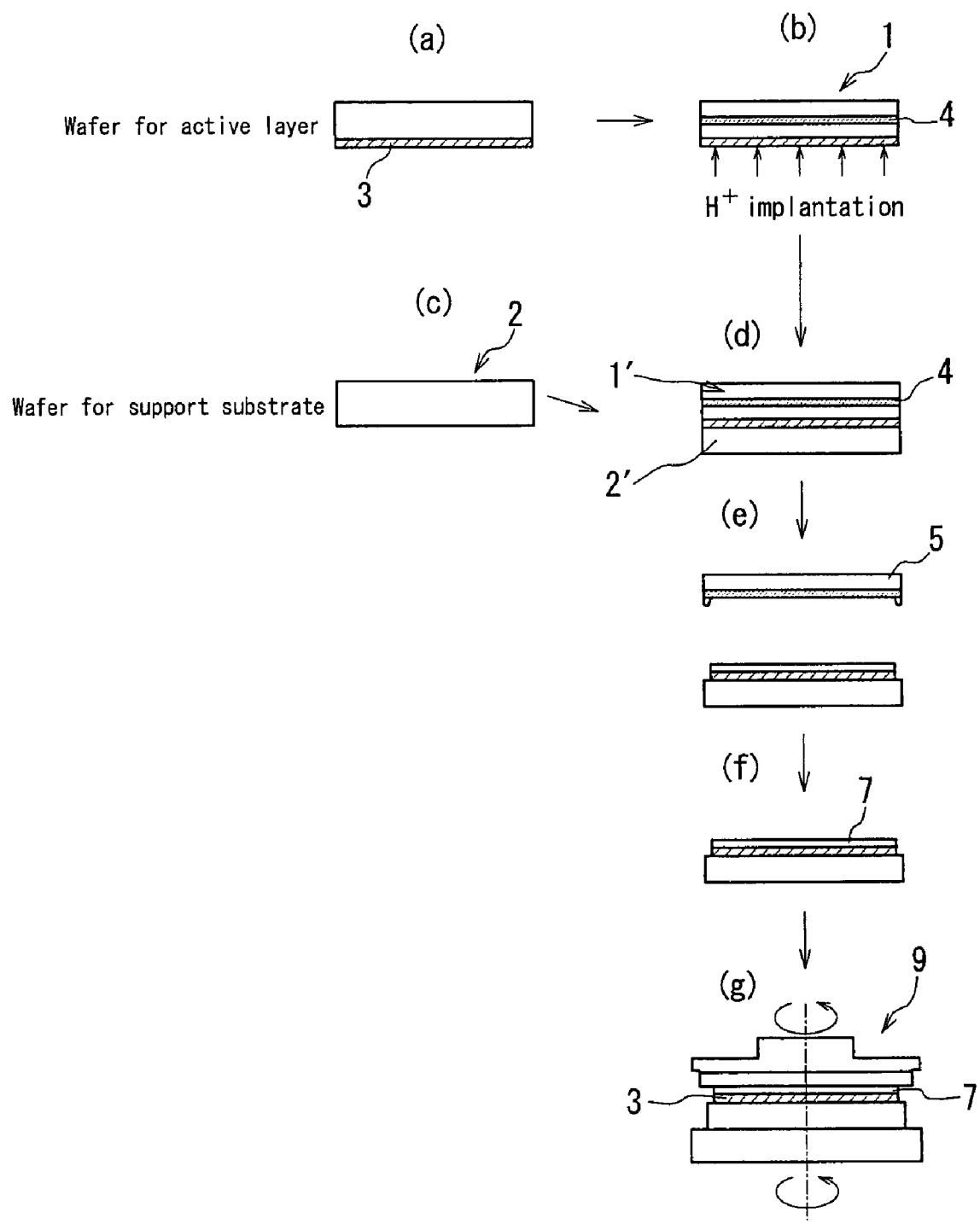
FIG. 2 is a flow chart showing production steps of a bonded wafer by a production method according to the invention, wherein (a) shows a wafer for active layer treated by a thermal oxidation, (b) shows the wafer for active layer implanted with H$^+$ ions, (c) shows a wafer for support substrate, (d) shows a state of bonding both wafers, (e) shows a state immediately after the exfoliation of the wafer for active layer through heat treatment, (f) shows a state of a bonded wafer after the exfoliation of the wafer for active layer, and (g) shows a state of polishing an active layer of the bonded wafer.

In FIG. 2 is shown a flow chart explaining steps of producing a bonded wafer by the production method according to the invention.

The production method according to the invention is a so-called smart cut method comprising the steps of subjecting at least one surface of a wafer 1 for active layer to a thermal oxidation to form an insulating film 3 (silicon oxide film) on such a surface (FIG. 2(a)), implanting ions of a light element such as hydrogen or helium to a predetermined depth position (concretely not more than 750 nm) of the wafer 1 for active layer (FIG. 2(b)), bonding the wafer 1 for active layer to a wafer for support substrate (FIGS. 2(c) and (d)), and then exfoliating the ion implanted portion through a heat treatment (FIG. 2(e)). In the bonded wafer produced by the smart cut method, when the insulating film 3 is thin (concretely not more than 50 nm), there is a problem that voids or blisters are easily generated on the way of the production steps to deteriorate the yield. Now, the inventors have made various studies on the method of producing the bonded wafer without generating the voids or blisters when the thickness of the active layer is not made thick before the thinning, and found that if the strength of the wafer for active layer itself can be enhanced, even when the thickness of the active layer before the thinning is thin, the swelling can be prevented and hence the occurrence of voids or blisters can be suppressed, and as a result, there is discovered a method capable of reducing the occurrence of voids or blisters even when the active layer is thin.

More concretely, as shown in FIG. 2, the production method according to the invention comprises a step of implanting ions of a light element such as H+ into a wafer 1 for active layer (FIG. 2(a)) provided on its surface with an insulating film 3 having a thickness of not more than 50 nm through thermal oxidation to form an ion implanted layer 4 at a predetermined depth from the surface (concretely not more than 750 nm) (FIG. 2(b)), a step of bonding the wafer 1 for active layer to a wafer 2 for support substrate (FIG. 2 (d)) and conducting a heat treatment in a nitrogen atmosphere at a given temperature, preferably 400-600° C. to exfoliate a portion 5 of the wafer for active layer at the ion implanted layer 4 (FIG. 2(e)), and a step of subjecting an active layer 7 exposed by the exfoliation (FIG. 2(f)) to a thinning treatment with a polishing machine 9 (FIG. 2(g)).

Moreover, it is necessary that the thickness of the active layer 7 before the thinning is not more than 750 nm. When the thickness is not more than 750 nm, the effect of the invention is developed remarkably.

Further, it is necessary that an elongation of slip dislocation in a strength test of the wafer 1 for active layer before the bonding is not more than 100 μm at a given thickness (typically about 700-800 μm). As the strength test may be used any strength tests capable of quantitatively knowing a strength of the wafer for active layer from an elongation of slip dislocation, and there is mentioned a method wherein an indentation is formed on the surface of the wafer by using a micro-Vickers hardness meter under conditions that a load is 100 g and a load applying time is 10 seconds and the wafer is placed in a heat treating furnace kept at 900° C. at a charging rate of 200 cm/min and heat-treated for 30 minutes and then taken out therefrom at a rate of 200 cm/min to measure a moving distance of a punched-out dislocation generated from the indentation as disclosed, for example, in Masanori Akatsuka, *Pinning Effect on Punched-out Dislocation in Silicon Wafers Investigated Using Indentation Method*, Japanese Journal of Applied Physics (Jpn. J. Appl. Phys.), vol. 36, Part 2, No. 11A, November 1997, pp 1422-1425.

Furthermore, the production method according to the invention may be applied to a case that the wafer 1 for active layer is bonded to the wafer 2 for support substrate without using the insulating film 3.

Also, the wafer 1 for active layer is preferable to contain one or more components selected from boron (B): not less than $1.0 \times 10^{19}$ atoms/cm$^3$, oxygen (O): not less than $1.4 \times 10^{18}$ atoms/cm$^3$ and carbon (C): not less than $2.0 \times 10^{16}$ atoms/cm$^3$ for increasing the strength of the wafer. When the content is less than the above range, the sufficient wafer strength is not obtained (the elongation of slip dislocation is not less than 100 μm). Moreover, the upper limit of the content of the above element(s) is not particularly limited but may be a solid solution limit. As the method of adding these elements is mentioned, for example, a method wherein the element(s) are added to a crucible containing a single crystal material before the pulling through a Czochralski method. Moreover, the measurement of the B, O and C contents is not particularly limited, but is carried out, for example, by a measuring machine of SIMS (Secondary Ion Mass Spectrometry), FTIR (Fourier transform infrared spectroscopy) or the like.

Furthermore, it is preferable that at least one of the wafer 1 for active layer and the wafer 2 for support substrate is subjected to a plasma treatment with a gas of nitrogen, oxygen or helium or a mixed gas thereof prior to the bonding step. By the plasma treatment can be more enhanced the activation of the bonding interface and the adhesive force of the bonding interface based on the removal of organic substances adhered to the bonding interface.

Although the above merely shows an example according to the embodiment of the invention, various modifications may be added within a scope of the invention.

TEST EXAMPLE 1

Example 1

In this example, the length of slip dislocation in the wafer is measured by the above strength test with respect to a silicon wafer for active layer having a size of 300 mm cut out from a silicon single crystal containing boron added at a boron concentration of $1.0 \times 10^{19}$ atoms/cm$^3$. After the measurement, an oxide film is formed as an insulating film on the wafer for active layer at a film thickness of 150 nm, 100 nm, 50 nm, 20 nm or 0 nm (no formation of oxide film), respectively. Then, the wafer for active layer is subjected to an ion implantation of hydrogen gas (acceleration voltage: 50 keV, dose: $1 \times 10^{17}$/cm$^2$) and thereafter bonded to a wafer for support substrate. The resulting bonded wafer is subjected to a heat treatment in a nitrogen atmosphere at 500° C. for 30 minutes to exfoliate a portion implanted with hydrogen ions. Moreover, the thickness of the active layer after the exfoliation differs in accordance with the thickness of the oxide film, which is 350 nm at the oxide film thickness of 150 nm, 400 nm at the oxide film thickness of 100 nm, 450 nm at the oxide film thickness of 50 nm, 480 nm at the oxide film thickness of 20 nm, or 500 nm in case of forming no oxide film.

Example 2

A bonded wafer is prepared in the same manner as in Example 1 except that boron is added at a boron concentration of $9.0 \times 10^{18}$ atoms/cm$^3$.

Example 3

A bonded wafer is prepared in the same manner as in Example 1 except that a silicon single crystal is obtained through the pulling by adjusting a rotation speed of a crucible so that an oxygen concentration is $1.4 \times 10^{18}$ atoms/cm$^3$.

Example 4

A bonded wafer is prepared in the same manner as in Example 1 except that a silicon single crystal is obtained through the pulling by adjusting a rotation speed of a crucible so that an oxygen concentration is $1.3 \times 10^{18}$ atoms/cm$^3$.

Example 5

A bonded wafer is prepared in the same manner as in Example 1 except that carbon is added at a carbon concentration of $2.0 \times 10^{16}$ atoms/cm$^3$.

Example 6

A bonded wafer is prepared in the same manner as in Example 1 except that carbon is added at a carbon concentration of $1.0 \times 10^{16}$ atoms/cm$^3$.

Comparative Example 1

A bonded wafer is prepared in the same manner as in Example 1 except that boron is added at a boron concentration of $8.0 \times 10^{18}$ atoms/cm$^3$.

Comparative Example 2

A bonded wafer is prepared in the same manner as in Example 1 except that a silicon single crystal is obtained through the pulling by adjusting a rotation speed of a crucible so that an oxygen concentration is $1.2 \times 10^{18}$ atoms/cm$^3$.

Comparative Example 3

A bonded wafer is prepared in the same manner as in Example 1 except that carbon is added at a carbon concentration of $9.0 \times 10^{15}$ atoms/cm$^3$.

Comparative Example 4

A bonded wafer is prepared in the same manner as in Example 1 except that the silicon wafer for active layer is added with boron, oxygen and carbon at a boron concentration of $1.0 \times 10^{16}$ atoms/cm$^3$, an oxygen concentration of $1.1 \times 10^{18}$ atoms/cm$^3$ and a carbon concentration of $5.0 \times 10^{15}$ atoms/cm$^3$, respectively.

(Evaluation Method 1)

With respect to the wafers prepared in Examples 1-6 and Comparative Examples 1-4, the presence or absence of voids or blisters is confirmed by visual inspection using a focusing lamp to obtain results shown in Table 1. Moreover, ○ shows a case that both of the voids and blisters are not existent, and X shows a case that either of voids and blisters is existent.

TABLE 1

Elongation of slip dislocation and presence or absence of void-blister

| | | Boron concentration | | | Oxygen concentration | | | Carbon concentration | | | Lower contents of these elements |
|---|---|---|---|---|---|---|---|---|---|---|---|
| | | Example 1 | Example 2 | Comparative Example 1 | Example 3 | Example 4 | Comparative Example 2 | Example 5 | Example 6 | Comparative Example 3 | Comparative Example 4 |
| | | 1.00E+19 | 9.00E+18 | 8.00E+18 | 1.40E+18 | 1.30E+18 | 1.20E+18 | 2.00E+16 | 1.00E+16 | 9.00E+15 | — |
| Elongation of slip dislocation (μm) | | 100 | 100 | 115 | 90 | 100 | 140 | 100 | 100 | 115 | 150 |
| Thickness of insulating film | 150 nm | ○ | ○ | ○ | ○ | ○ | ○ | ○ | ○ | ○ | ○ |
| | 100 nm | ○ | ○ | ○ | ○ | ○ | ○ | ○ | ○ | ○ | ○ |
| | 50 nm | ○ | ○ | X | ○ | ○ | X | ○ | ○ | X | X |
| | 20 nm | ○ | ○ | X | ○ | ○ | X | ○ | ○ | X | X |
| | 0 | ○ | X | X | X | ○ | X | X | ○ | X | X |

○: no void-blister,

X: presence of void-blister

As seen from the results of Table 1, in Examples 1-6, the elongation of slip dislocation is 90-100 μm and the occurrence of voids or blisters is not caused even when the thickness of the insulating film is as thin as 20-50 nm. Also, Examples 1, 3 and 5 do not cause the occurrence of voids or blisters even when the insulating film is not formed. On the contrary, in Comparative Examples 1-4, the elongation of slip dislocation is 115-150 μm and the occurrence of voids or blisters is caused when the thickness of the insulating film is not more than 50 nm.

TEST EXAMPLE 2

Example 7

A bonded wafer is prepared in the same manner as in Example 1 except that boron is added at a boron concentration of $9.0 \times 10^{18}$ atoms/cm$^3$ and a plasma treatment is applied to bonding faces of both wafers for active layer and wafer for support substrate in a nitrogen gas atmosphere before the bonding.

Example 8

A bonded wafer is prepared in the same manner as in Example 1 except that a silicon single crystal is obtained through the pulling by adjusting a rotation speed of a crucible so that an oxygen concentration is $1.3 \times 10^{18}$ atoms/cm$^3$ and a plasma treatment is applied to bonding faces of both wafers for active layer and wafer for support substrate in a nitrogen gas atmosphere before the bonding.

Example 9

A bonded wafer is prepared in the same manner as in Example 1 except that carbon is added at a carbon concentration of $2.0 \times 10^{16}$ atoms/cm$^3$ and a plasma treatment is applied to bonding faces of both wafers for active layer and wafer for support substrate in a nitrogen gas atmosphere before the bonding.

(Evaluation Method 2)

With respect to the wafers prepared in Examples 7-9, the presence or absence of voids or blisters is confirmed by visual inspection using a focusing lamp to obtain results shown in Table 2. Moreover, ○ shows a case that both of the voids and blisters are not existent, and X shows a case that either of voids and blisters is existent.

TABLE 2

Elongation of slip dislocation and presence or absence of void-blister (Plasma treatment)

|  |  | Boron concentration Example 7 | Oxygen concentration Example 8 | Carbon concentration Example 9 |
|---|---|---|---|---|
|  |  | 9.00E+18 | 1.30E+18 | 1.00E+16 |
| Elongation of slip dislocation (μm) |  | 100 | 100 | 100 |
| Thickness of insulating film | 150 nm | ○ | ○ | ○ |
|  | 100 nm | ○ | ○ | ○ |
|  | 50 nm | ○ | ○ | ○ |
|  | 20 nm | ○ | ○ | ○ |
|  | 0 | ○ | ○ | ○ |

○: no void-blister,
X: presence of void-blister

As seen from the results of Table 2, in Examples 7-9, the elongation of slip dislocation is not more than 100 μm and the occurrence of voids or blisters is not caused even when the thickness of the insulating film is 0. As a result of the comparison with Examples 2, 4 and 6 using the same wafers, it is confirmed that the occurrence of voids or blisters can be further suppressed in Examples 7-9.

According to the invention, there can be provided a method of producing a bonded wafer wherein the occurrence of voids or blisters can be effectively suppressed by using a wafer for active layer having a predetermined strength without thickening the thickness of the active layer before the thinning (particularly not more than 750 nm) even when the thickness of the insulating film is not more than 50 nm (inclusive of no insulating film).

What is claimed is:

1. A method of producing a bonded wafer comprising: implanting ions of a light element such as hydrogen or helium into a wafer for active layer to a predetermined depth position to form an ion implanted layer; bonding the wafer for an active layer to a wafer for support substrate directly or through an insulating film of not more than 50 nm; exfoliating the wafer for active layer at the ion implanted layer; and thinning an active layer exposed through the exfoliation to form the active layer having a predetermined thickness, in which the thickness of the active layer before the thinning is not more than 750 nm and an elongation of slip dislocation in a strength test of the wafer for active layer before the bonding is not more than 100 μm at a predetermined thickness.

2. A method of producing a bonded wafer according to claim 1, wherein the wafer for active layer contains one or more components selected from B: not less than $9.0 \times 10^{18}$ atoms/cm$^3$, O: not less than $1.3 \times 10^{18}$ atoms/cm$^3$ and C: not less than $1.0 \times 10^{16}$ atoms/cm$^3$.

3. A method of producing a bonded wafer according to claim 1 or 2, wherein at least one surface of the wafers to be bonded is subjected to a plasma treatment with a gas of nitrogen, oxygen, helium or a mixture thereof before the bonding.

* * * * *